United States Patent [19]
Barbu et al.

[11] Patent Number: 5,063,312
[45] Date of Patent: Nov. 5, 1991

[54] DELAY CIRCUIT WITH ADJUSTABLE DELAY

[75] Inventors: Stéphane Barbu, Caen; Laurent Le Pailleur, Herouville St. Clair, both of France

[73] Assignee: U.S. Philips Corporation, New York, N.Y.

[21] Appl. No.: 618,778

[22] Filed: Nov. 27, 1990

[30] Foreign Application Priority Data

Nov. 28, 1989 [FR] France .................. 89 15624

[51] Int. Cl.$^5$ ............. H03K 5/13; H03K 5/159
[52] U.S. Cl. ................. 307/603; 307/608; 307/594
[58] Field of Search ............ 307/601, 602, 603, 605, 307/608, 592, 594–596

[56] References Cited

U.S. PATENT DOCUMENTS

| | | | |
|---|---|---|---|
| 4,611,136 | 9/1986 | Fujie | 307/603 |
| 4,795,923 | 1/1989 | Dobos | 307/608 |
| 4,797,586 | 1/1989 | Traa | 307/603 |
| 4,862,020 | 8/1989 | Cowan et al. | 307/603 |
| 4,866,314 | 9/1989 | Traa | 307/603 |

Primary Examiner—David Hudspeth
Assistant Examiner—Andrew Sanders
Attorney, Agent, or Firm—Bernard Franzblau

[57] ABSTRACT

A delay circuit with adjustable delay employs a switching flip-flop which includes a differential amplifier (A) having two outputs each one feedback-looped respectively onto two inputs, so as to produce the said switching. The looping is produced by a first (AD1) and a second (AD2) adder, each having a first, a second and a third input. The first inputs are connected to corresponding outputs of the differential amplifier to produce the feedback looping. The second inputs are intended to be connected respectively to a first and a second terminal delivering a signal to be delayed ($V_1^+$, $V_1^-$) and the third inputs recieve respectively a first and a second control voltage ($V_3^+$, $V_3^-$). The delay is a function of the difference between the first and the second control voltage. The outputs of the adders are connected respectively to corresponding inputs of the differential amplifier.

8 Claims, 2 Drawing Sheets

DELAY CIRCUIT WITH ADJUSTABLE DELAY

The subject of the present invention is a delay circuit with adjustable delay employing a switching flip-flop.

According to the prior art, such a circuit employs a D-type flip-flop associated with a clock. The delay is determined by a resistance-capacitance product RC, which renders difficult the obtainment of a variable delay in an integrated circuit.

The patents US-4 795 923 and US-4 862 020 describe integratable delay circuits whose delay is continuously adjustable with the aid of a variable voltage. These circuits require several differential stages, the outputs of which are coupled, hence resulting in relatively complicated circuits. The subject of the present invention is a circuit of the type mentioned in the first paragraph and whose delay is continuously adjustable as well as being simple to employ.

The circuit according to the invention is thus characterized in that it comprises a differential amplifier (A) having a first and a second input and a first and a second output, the first and second output being feedback-looped respectively onto the first and the second input, in such a way as to produce the said switching flip-flop, the looping including a first (AD1) and a second (AD2) adder, each adder having a first, a second and a third input as well as an output, the said first inputs of the first and second adder being connected to respectively the first and second output of the differential amplifier to produce the said feedback looping, the said second inputs being connected respectively to a first and a second terminal to receive a signal to be delayed ($V_1^+$, $V_1^-$) and the third inputs being laid out in such a way as to receive a first and a second control voltage ($V_3^+$, $V_3^-$), the said delay being a function of the difference between the first and the second control voltage ($V_3^+$, $V_3^-$) and the outputs of the first and second adders (AD1, AD2) being connected respectively to the first and second inputs of the differential amplifier (A).

According to a preferred embodiment, at least one of the said adders comprises a first and a second transistor whose base is connected respectively to the corresponding terminal and to the corresponding output of the differential amplifier and whose main current path is arranged in series with in succession respectively a first resistor and a first current source for the first transistor and a second resistor and a second current source for the second transistor, and in that it comprises a serial branch comprising a third and a fourth resistor which are connected, on the one hand, to the point common to the first resistor and to the first current source and, on the other hand, to the point common to the second resistor and to the second current source. The first and second resistors may have the same value. The first and the second current source may have the same value of current.

The first and the second control voltage advantageously have the value $V_0 + \Delta V$ and $V_0 - \Delta V$ respectively, $\Delta V$ being a variable whose absolute value is less than that of the constant $V_0$.

The invention will be better understood on reading the description which is given by way of non-limiting example with reference to the drawings in which.

Figure 1:
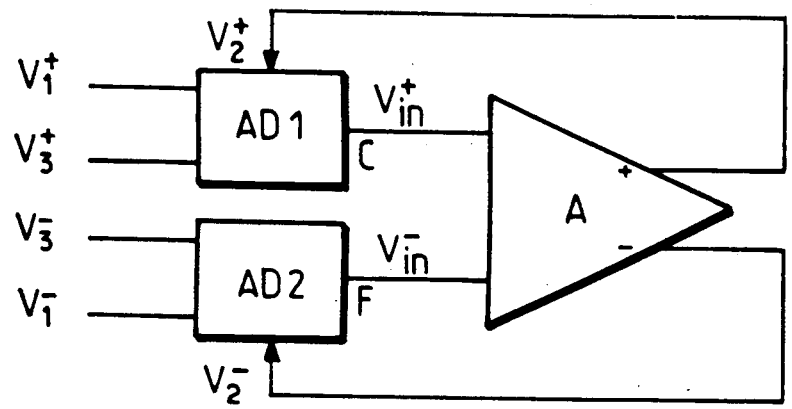
FIG. 1 shows a delay circuit according to the invention.

According to FIG. 1, a differential amplifier A has two inputs and two outputs delivering signals $V_2^-$ and $V_2^+$ respectively. These two outputs are feedback-looped onto corresponding inputs through two multi-input adders AD1 and AD2 respectively. This feedback looping thus produces a switching flip-flop.

Besides the feedback input receiving the signal $V_2^+$ the adder AD1 has a signal input receiving a signal $V_1^+$ and a control input receiving a d.c. voltage level $V_3^+$ which can be varied.

Besides the feedback input receiving the signal $V_2^-$, the adder AD2 has a signal input receiving a signal $V_1^-$ and a control input receiving a d.c. voltage level $V_3^-$ which can be varied.

Figure 2:
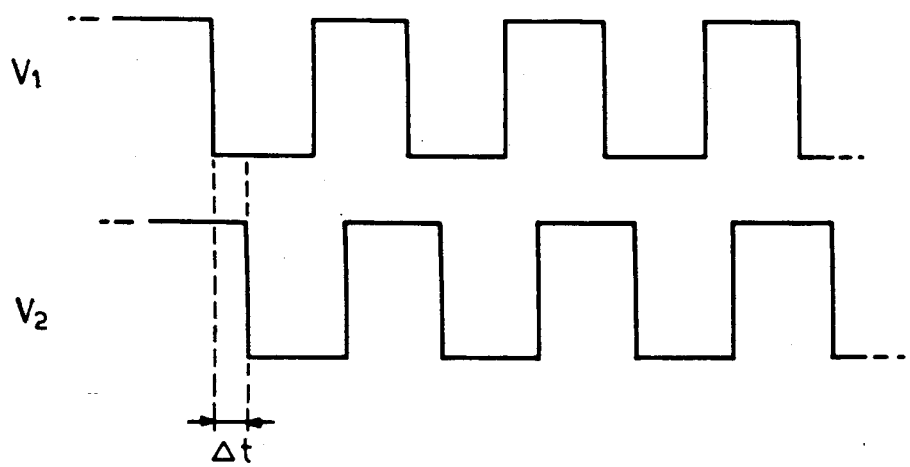
FIG. 2 shows an illustration of the delay function of the circuit according to the invention.

The signals $V_1^-$ and $V_1^-$ are representative of the two polarities of the input signal to be delayed. The signals $V_3^+$ and $V_3^-$ are employed to obtain the offset operation of the switching flip-flop and their value influences the value of the delay $\Delta t$. FIG. 2 illustrates the delay value $\Delta t$ for squarewave signals.

It is possible, for example, to set:

$$V_3^+ = V_0 + \Delta V$$

$$V_3^- = V_0 - \Delta V$$

$V_0$ = constant voltage. $\Delta V$ = variable voltage (positive, negative or zero) of absolute value less than that of $V_0$.

The control signals may be directly control voltages inserted at the third inputs of voltage adders.

Figure 3A:
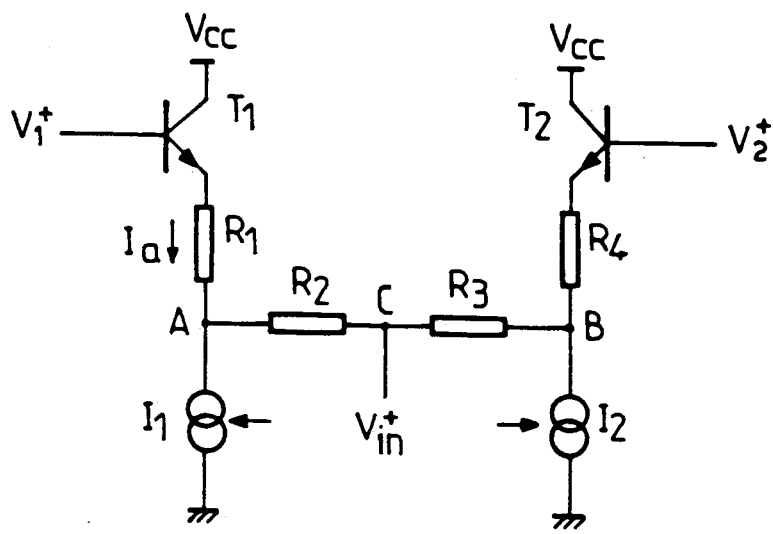
FIGS. 3a, 3b and 4 show embodiments of the invention.
Figure 3B:
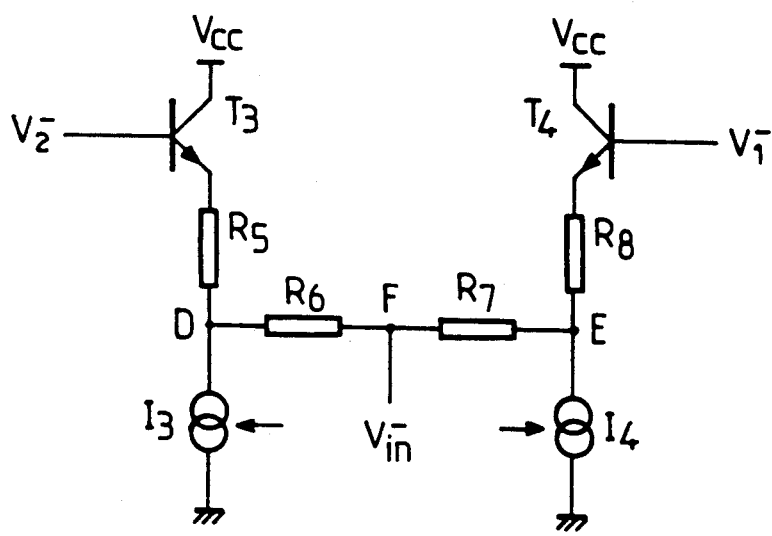

FIG. 3a and 3b represent a preferred embodiment of the adders AD1 and AD2, for which the voltages $V_3^+$ and $V_3^-$ come in by way of current sources. The control signals are then for example voltages controlling the intensity of the current sources.

According to FIG. 3a, the adder AD1 comprises two npn transistors $T_1$ and $T_2$ whose collector is connected to a voltage supply source $V_{cc}$, whose base receives the signals $V_1^+$ and $V_2^+$ respectively, and whose emitter is connected to a branch comprising in series, for the transistor $T_1$, a resistor $R_1$ and a variable current source $I_1$, and for the transistor $T_2$, a resistor $R_4$ in series with a variable current source $I_2$.

Between the point A common to the resistor $R_1$ and to the variable current source $I_1$, and the point B common to the resistor $R_4$ and to the variable current source $I_2$, are arranged two resistors in series $R_2$ and $R_3$ whose common point C, which delivers the signal $V_{in}^+$ is connected to one input of the amplifier A.

The current from the current sources $I_1$ and $I_2$ may be controlled by a voltage, preferably the same voltage. This enables production in integrated circuit form.

According to FIG. 3b, the adder AD2 comprises two npn transistors $T_3$ and $T_4$ whose collector is connected to the voltage supply source $V_{cc}$ whose base receives the signals $V_2^-$ and $V_1^-$ respectively and whose emitter is connected to a branch comprising in series, for the transistor $T_3$, a resistor $R_5$ and a variable current source $I_3$, and for the transistor $T_4$, a resistor $R_8$ and a variable current source $I_4$.

Between the point D common to the resistor $R_5$ and to the variable current source $I_3$, and the point E common to the resistor $R_8$ and to the variable current source $I_4$, are arranged two resistors in series $R_6$ and $R_7$ whose common point F, which delivers the signal $V_{in}^-$ is connected to the other input of the amplifier A. The connected to the other input of the amplifier A. The current from the current sources $I_3$ and $I_4$ may be controlled by one and the same voltage.

Figure 4:
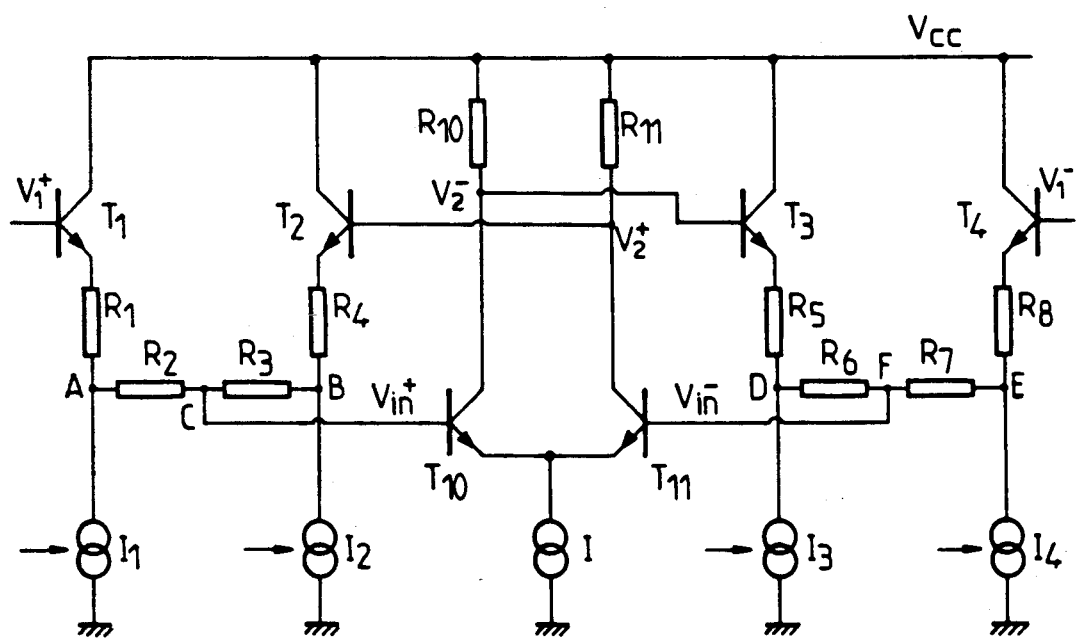

FIG. 4 shows a preferred embodiment in which the adders AD1 and AD2 both conform to the deployments of FIG. 3a and 3b (with the same reference labels) and in which the amplifier A consists of a differential stage including two transistors $T_{10}$ and $T_{11}$ whose coupled emitters are connected to a current source I. The collectors of the transistors $T_{10}$ and $T_{11}$ are connected to the voltage supply source $V_{cc}$ through resistors $R_{10}$ and $R_{11}$ respectively, and their bases are connected to the points C and F, respectively. The collector of the transistor $T_{10}$, which delivers the output signal $V_2^-$, is connected to the base of the transistor $T_3$, and the collector of the transistor $T_{11}$, which delivers the output signal $V_2^+$, is connected to the base of the transistor $T_2$.

The basic idea of the invention consists in varying the quiescent point of the inputs of the differential amplifier in order to vary the delay $\Delta t$. In other words, the points C and F are brought to d.c. potentials which can be varied, and the delay depends, as will now be shown, on the difference between these potentials.

Let $I_a$ (FIG. 3a) be the current flowing in the resistor $R_1$.

Let $V_{BE1}$ be the base-emitter voltage of the transistor $T_1$ and $V_{BE2}$ that of the transistor $T_2$. Neglecting the base resistances and the base currents, we have :

$$V_1^+ - V_{BE1} - R_1 I_a - (I_a - I_1)(R_2 + R_3) = V_2^+ - V_{BE2} - R_4(I_1 + I_2 - I_1)$$

and $$V_{BE1} - V_{BE2} = V_T LOG \{I_a/(I_1 + I_2 - I_a)\} V_T = 26 \text{ mV}$$

whence $$V_{BE1} \simeq V_{BE2} \text{ if } I_a \simeq (I_1 + I_2)/2$$

this condition will be explained further on. By assumption, we choose :

$$R_1 = R_4 \quad R_2 = R_3 \quad I_1 = I_2 = I_0 + \Delta I$$

We then have :

$$I_a = \frac{V_1^+ - V_2^+ + 2I_1(R_1 + R_2)}{2(R_1 + R_2)} = \frac{V_1^+ - V_2^+}{2(R_1 + R_2)} + I_1 \quad (1)$$

$$V_{in}^+ = V_1^+ - R_1 I_a - R_2(I_a - I_1) - V_{BE1}$$
$$V_{in}^+ = (V_1^+ + V_2^+)/2 - R_1(I_0 + I) - V_{BE1}$$

which corresponds to a value of $V_3^+$ $$V_3^+ = 2R_1(I_0 + \Delta I)$$

(the adder AD1 has a gain of 0.5)

$$V_{BE1} \simeq V_{BE2} \text{ if } I_a \simeq I_1 \text{ that is}$$
$$(V_1^+ - V_2^+) << 2(R_1 + R_2)I_1$$

In the same way, for the diagram of FIG. 3b and with the assumptions $R_5 = R_8$ and $R_6 = R_7$, $I_3 = I_4 = I_0 - \Delta I$, we obtain:

$$V_{in}^- = \frac{V_1^- + V_2^-}{2} - R_5(I_0 - \Delta I) - V_{BE4} \quad (2)$$

whence $$V_3^- = -2R_5(I_0 - \Delta I). \text{ (adder of gain 0.5)}.$$

$$V_{BE3} \simeq V_{BE4} \text{ if } (V_1^- - V_2^-) << 2(R_5 + R_6)I_3$$

$V_{BE3}$ and $V_{BE4}$ designating the base-emitter voltages of the transistors $T_3$ and $T_4$.

The equations (1) and (2) then give (on choosing $R_1 = R_5$)

$$\Delta V_{in} = V_{in}^+ - V_{in}^- = \frac{V_1^+ - V_1^-}{2} + \frac{V_2^+ - V_2^-}{2} = 2R_1 \Delta I + (V_{BE4} - V_{BE1}) \quad (3)$$

$\Delta V_{in}$ represents the offset of the operating point of the switching flip-flop. It varies linearly as a function of $\Delta I$.

In accordance with the equations governing the differential stages, we have :

$$V_2^+ - V_2^- = \frac{R_{10} I}{2} \text{th}\left(\frac{V_{in}^+ - V_{in}^-}{2 V_T}\right)$$

with $R_{10} = R_{11}$, th=hyperbolic tangent function. On equilibrium of the differential stage ($V_{in}^+ = V_{in}^-$), $V_1^+$ is not equal to $V_1^+$.

In fact, we then have :

$$V_1^+ - V_1^- = 4R_1 \Delta I + 2V_T LOG \{(I_0 + \Delta I)/I_0 - \Delta I)\}$$

The difference between $V_1^+$ and $V_1^-$ at equilibrium of the differential stage depends only on $\Delta I$, that is to say on the difference between the currents in the adders of FIG. 3a and 3b.

The formula giving the response time at 50%, denoted $t_50$, of the amplitude is as follows: $t_{50} = 4V_T/R_{10} I$ $\sqrt{Log} (2 + R_{10}I/4V_T + R_{10}I/VT \cdot \Delta I/\Delta V_1)$ $t_{50}$ may be taken as the characteristic value of the delay, with $V_1$ — peak-to-peak amplitude of the signal to be delayed, and $\tau$ = intrinsic response time of the differential stage, $$\tau = \frac{R_{10}(R_1 + R_2)C}{R_{10} + R_1 + R_2}$$

C=capacitance of the differential stage in its equivalent diagram.

(one capacitance C for each of the collectors of $T_{10}$ and $T_{11}$).

The above calculations were performed with certain assumptions ($R_1 = R_4 = R_5 = R_8$, $R_2 = R_3$ and $R_6 = R_7$), but of course this did not involve necessary conditions. In particular, the ratios between R6hd 1 and $R_4$, $R_5$ and $R_8$, on the one hand, and between $R_2$ and $R_3$, and $R_6$ and $R_7$ on the other hand, influence the symmetry of the waveform, that is to say enable the obtainment of a rise time equal to or different from the fall time. Different response times can in fact be obtained on each input if AD1 and AD2 are different.

For $R_2 < R_3$, a phase advance is obtained for the corresponding input and a phase delay for $R_2 > R_3$.

For $R_1 < R_4$, a phase advance is obtained for the corresponding input and a phase delay for $R_1 > R_4$.

Similar reasoning applies to the ratios between $R_5$ and $R_8$ on the one hand, and $R_6$ and $R_7$ on the other hand.

In fact, the values of the said resistors influence the value of the difference between $V_{in}^+$ and $V_{in}^-$ on the one hand and on the value of $\tau$ on the other hand.

Under the assumption that the two devices AD1 and AD2 are structurally identical, we have in fact :

$\Delta V_{in} =$ $V_{in}^+ - V_{in}^- = (R_3 + R_4)/(R_1 + R_2 + R_3 + R_4) [(V_1^+ - V_1^-) -$ $R_1(I_1 - I_3) - (V_{BE1} - V_{BE2}^0] +$ $(R_1 + R_2)/(R_1 + R_2 + R_3 + R_4) [(V_2^+ - V_2^-) -$ $R_4(I_2 - I_4) - (V_{BE3} - V_{BE4})]$ and $I_1 - I_3 = I_2 - I_4 = 2 \Delta I.$ On inverting the formula cited earlier and giving $V_2^+ - V_2^-$ as a function of $V_{in}^+ - V_{in}^-$ we have:

$V_{in}^+ - V_{in}^- = 2V_T arc\, th\, \{2(V_2^+ - V_2^-) / R_{10}I\}$ arc th = inverse hyperbolic tangent function. whence :

$V_1^+ - V_1^- =$ $\dfrac{2(R_1 + R_2 + R_3 + R_4)}{R_3 + R_4} V_T arc\, th\, \dfrac{2(V_2^+ - V_2^-)}{R_{10}I} -$ $\dfrac{R_1 + R_2}{R_3 + R_4} [(V_2^+ - V_2^-) - R_4 (I_2 - I_4) - (V_{BE3} - V_{BE4})] +$ $\dfrac{R_1}{R_3 + R_4} [(I_1 - I_3) + (V_{BE1} - V_{BE2})]$ The hysteresis condition may be written :

$\dfrac{d(V_1^+ - V_1^-)}{d(V_2^+ - V_2^-)} = 0$ that is $(V_2^+ - V_2^-)hyst = \dfrac{R_{10}I}{2} \sqrt{1 - \dfrac{2V_T}{R_{10}I}\left(1 + \dfrac{R_3 + R_4}{R_1 + R_2}\right)}$ whence the operating condition $1 + \dfrac{R_3 + R_4}{R_1 + R_2} < \dfrac{R_{10}I}{2V_T}.$

We claim:

1. A delay circuit with adjustable delay employing a switching flip-flop which comprises: a differential amplifier having a first and a second input and a first and a second output, the first and second output being feedback-looped respectively onto the first and the second input so as to produce said switching flip-flop, the looping including a first and a second adder, each adder having a first, a second and a third input and an output, said first inputs of the first and second adder being connected to respectively the first and second output of the differential amplifier to produce said feedback looping, the second inputs being connected respectively to a first and a second terminal to receive a signal to be delayed ($V_1^+$, $V_1^-$) and the third inputs being adapted to receive a first and a second control voltage ($V_3^+$, $V_3^-$), said delay being a function of the difference between the first and the second control voltage ($V_3^+$, $V_3^-$), and the outputs of the first and second adders being connected respectively to the first and second inputs of the differential amplifier.

2. A delay circuit asccording to claim 1, wherein at least one of the adders comprises a first and a second transistor having a base connected respectively to the corresponding terminal and to a corresponding one of said first and second terminals output of the differential amplifier and with a main current path of the first transistor connected in series with a first resistor and a first current source and with a main current path of the second transistor connected in series with a second resistor, and a serial branch comprising a third and a fourth resistor connected to a point common to the first resistor and to the first current source and to a point common to the second resistor and to the second current source.

3. A delay circuit according to claim 2, wherein first and second resistors have substantially the same resistance value and the first and second current sources have substantially the same value of current.

4. A delay circuit according to claim 3 wherein the third and fourth resistors have substantially the same resistance value.

5. A delay circuit according to claim 4 wherein the first and second control voltage have a value $V_0 + \Delta V$ and $V_0 - \Delta V$ respectively, $\Delta V$ being a variable whose absolute value is less than $V_0$.

6. A delay circuit according to claim 2 wherein the third and fourth resistors have substantially the same resistance value.

7. A delay circuit according to claim 1 wherein the first and second control voltage have a value $V_0 + \Delta V$ and $V_0 - \Delta V$ respectively, $\Delta V$ being a variable whose absolute value is less than $V_0$.

8. A delay circuit according to claim 2 wherein the first and second control voltage have a value $V_o + \Delta V$ and $V_0 - \Delta V$ respectively, $\Delta V$ being a variable whose absolute value is less than $V_0$.

* * * * *

UNITED STATES PATENT AND TRADEMARK OFFICE
CERTIFICATE OF CORRECTION

PATENT NO. : 5,063,312

DATED : NOVEMBER 5, 1991

INVENTOR(S) : STEPHANE BARBU ET AL

Page 1 of 4

It is certified that error appears in the above-identified patent and that said Letters Patent is hereby corrected as shown below:

<u>IN THE ABSTRACT</u>
item [57],
    line 4, after "inputs" delete the comma;
    line 12, change "recieve" to --receive--.

Column 1, line 9, change "renders" to --makes it--;
                   change "the" to --to--;
                   change "obtainment of" to --obtain--;
    line 11, change "US-" (both occurrences) to
              --USP--; change "4 795 923" to
             --4,795,923--; change "4 862 020" to
             --4,862,020--;
between lines 19 and 20, add as a centered heading:

line 23, change ", the" to --. The--; change
         "being" to --are--;
    line 24, after "input" delete the comma;
    line 25, after "flip-flop" change "," (comma) to
         --.--;
    line 26, change "the" to --The--; change
         "including" to --includes--;
    line 28, change ", the said" to --. The--;
    line 29, change "being" to --are--; delete
         "respectively";
    line 30, after "output" insert --, respectively,--;
    line 31, change "looping, the said" to --looping.
         The--;
    line 32, change "being" to --are--;
    line 34, delete "being laid out in such a way";

UNITED STATES PATENT AND TRADEMARK OFFICE
CERTIFICATE OF CORRECTION

PATENT NO. : 5,063,312
DATED : NOVEMBER 5, 1991
INVENTOR(S) : STEPHANE BARBU ET AL

Page 2 of 4

It is certified that error appears in the above-identified patent and that said Letters Patent is hereby corrected as shown below:

```
        line 35, delete "as to"; before "first" insert
                --respective--;
        line 36, change ", the said delay being" to --.
                The delay is--;
        line 38, change "and the" to --. The--;
        line 39, change "being" to --are--;
        line 43, change "is" to --electrodes are--;
        line 44, after "corresponding" insert --signal--;
        line 45, change "and whose" to --. The--; after
                "path" insert --of each transistor--;
        line 46, after "with" insert --,--;
                after "succession" insert --,--;
                after "respectively" insert --,--;
        line 49, change ", and in that it" to --.  The
                adder further--;
        line 59, before "respec-" insert --,--;
  between lines 61 and 62, insert as a centered heading:

line 62, change "on reading" to --from--;
        line 63, after "the" insert --following--;
        line 64, after "the" insert --accompanying--.
Column 2, between lines 2 and 3, insert as a centered heading:

line  9, after "+" insert --,--;
        line 31, change "directly" to --direct--;
        line 33, change "FIG." to --FIGS.--;
```

UNITED STATES PATENT AND TRADEMARK OFFICE
CERTIFICATE OF CORRECTION

PATENT NO. : 5,063,312

DATED : NOVEMBER 5, 1991

INVENTOR(S) : STEPHANE BARBU ET AL

Page 3 of 4

It is certified that error appears in the above-identified patent and that said Letters Patent is hereby corrected as shown below:

line 36, after "then" insert --,--; after "example" insert --,--;
    line 39, change "collector is" to --collectors are--;
    line 40, change "base receives" to --bases receive--;
    line 41, before "whose" insert --each of--;
    line 42, after "comprising" insert --,--;
    line 50, after "+" insert --,--;
    line 56, change "collector is" to --collectors are--;
    line 57 before "whose" insert --,--;
    line 58, before "respectively" insert --,--; after "and" insert --each of--;
    line 59, after "comprising" insert --,--.
Column 4, line 39, change "t$_5$0" to --$t_{50}$--;

UNITED STATES PATENT AND TRADEMARK OFFICE
CERTIFICATE OF CORRECTION

PATENT NO. : 5,063,312
DATED : November 5, 1991
INVENTOR(S) : Stephane Barbu et al It is certified that error appears in the above-indentified patent and that said Letters Patent is hereby corrected as shown below:

Column 6, line 20, change "terminal" to --one of said first and second terminals--; delete "One of";

line 21, delete "said first and second terminals";
       line 25, after "resistor" insert --and a second current source--.
       line 30, after "wherein" insert --the--.

Signed and Sealed this

Twenty-second Day of March, 1994

Attest:

BRUCE LEHMAN

*Attesting Officer*     *Commissioner of Patents and Trademarks*